US009275859B2

(12) United States Patent
Yoo et al.

(10) Patent No.: US 9,275,859 B2
(45) Date of Patent: Mar. 1, 2016

(54) APPARATUS AND METHOD FOR MANUFACTURING A LIGHT-EMITTING DEVICE USING A NEUTRAL PARTICLE BEAM

(75) Inventors: Suk Jae Yoo, Daejeon (KR); Seong Bong Kim, Daejeon (KR)

(73) Assignee: KOREA BASIC SCIENCE INSTITUTE, Daejeon (KR)

(*) Notice: Subject to any disclaimer, the term of this patent is extended or adjusted under 35 U.S.C. 154(b) by 206 days.

(21) Appl. No.: 14/006,937

(22) PCT Filed: May 30, 2011

(86) PCT No.: PCT/KR2011/003943
§ 371 (c)(1),
(2), (4) Date: Sep. 23, 2013

(87) PCT Pub. No.: WO2012/128420
PCT Pub. Date: Sep. 27, 2012

(65) Prior Publication Data
US 2014/0017827 A1  Jan. 16, 2014

(30) Foreign Application Priority Data
Mar. 23, 2011 (KR) ........................ 10-2011-0026029

(51) Int. Cl.
*H01L 21/02* (2006.01)
*H01L 21/67* (2006.01)
(Continued)

(52) U.S. Cl.
CPC ............ *H01L 21/0257* (2013.01); *C30B 25/02* (2013.01); *C30B 25/105* (2013.01); *C30B 29/406* (2013.01); *H01L 21/0254* (2013.01); *H01L 21/0262* (2013.01);
(Continued)

(58) Field of Classification Search
CPC ............ H01L 21/0254; H01L 21/0257; H01L 21/02579; H01L 21/02458; H01L 21/67161; H01L 21/67207
See application file for complete search history.

(56) References Cited

U.S. PATENT DOCUMENTS

2005/0205110 A1* 9/2005 Kao .................. H01J 37/32082
134/1.1
2006/0213443 A1* 9/2006 Yeom .................... C23C 16/452
118/723 FI
(Continued)

FOREIGN PATENT DOCUMENTS

KR  20100133056 A * 12/2010 ............... H15H 3/06

*Primary Examiner* — Joseph C Nicely

(57) ABSTRACT

The present invention relates to an apparatus and method for manufacturing a semiconductor light-emitting device using a neutral particle beam. According to the present invention, since the kinetic energy of the neutral particle beam is provided as a portion of the reaction energy for causing a nitride semiconductor single crystal thin film to be formed on a substrate, and the reaction energy is not provided as heat energy by heating a substrate as in the prior art, the substrate may be treated at a relatively low temperature. Furthermore, elements such as Si, Mg, and the like, which are solid elements required for doping are sprayed onto the substrate from a source which generates solid elements for doping together with the neutral particle beam to achieve high doping efficiency at a lower temperature. According to the present invention, since the substrate is treated at a low temperature, the degradation of the substrate and thin film may be prevented, and the undesired diffusion of the doping elements may be prevented to enable the manufacture of the semiconductor light-emitting device having superior light-emitting properties in a relatively easy manner.

7 Claims, 7 Drawing Sheets

(51) Int. Cl.
*H01L 33/00* (2010.01)
*C30B 25/02* (2006.01)
*C30B 25/10* (2006.01)
*C30B 29/40* (2006.01)

(52) U.S. Cl.
CPC ... *H01L 21/02458* (2013.01); *H01L 21/02576* (2013.01); *H01L 21/02579* (2013.01); *H01L 21/02631* (2013.01); *H01L 21/02656* (2013.01); *H01L 21/67161* (2013.01); *H01L 21/67207* (2013.01); *H01L 33/0066* (2013.01)

(56) References Cited

U.S. PATENT DOCUMENTS

2007/0114124 A1* 5/2007 Hoffbauer ............... B29C 59/14
204/192.12
2010/0302464 A1* 12/2010 Raring ................. H04N 9/3129
348/744
2012/0156819 A1* 6/2012 Zhu .................... C23C 14/0641
438/47

\* cited by examiner (a) MOCVD process (b) neutral beam epitaxial process

① n - Gan ( MOCVD )  
② MQW ( NBE )  
③ D - GAN ( NBE )  
④ transparent electrode(sputter)

APPARATUS AND METHOD FOR MANUFACTURING A LIGHT-EMITTING DEVICE USING A NEUTRAL PARTICLE BEAM

TECHNOLOGY FIELD

The present invention relates to a manufacturing method and manufacturing apparatus for a light emitting device. In more detail, it relates to the use of a neutral particle beam method and system for single crystal nitride semiconductor formation in which thin film deposition occurs at a low temperature.

BACKGROUND OF THE INVENTION

In general, nitride single crystal semiconductor thin film deposition is widely used
for forming a light-emitting diodes (LED) or a laser diodes. In order to form nitride single crystal semiconductors on a substrate it is generally necessary to maintain the substrate at a high temperature.

Conventional thin film processes require temperatures above 1,000° C. for crystal growth. The application area of single crystals that are made at such a high temperature is very limited.

Typical technologies used to form conventional nitride semiconductor crystals include MOCVD (Metal Organic CVD) and MBE (Molecular Beam Epitaxy). To obtain a nitride semiconductor thin film using these methods, the substrate should be maintained at a temperature between 1,050 and 1,100° C. Accordingly, deterioration of the substrate on which nitride semiconductor thin films are formed, for example due to thermal expansion of the sapphire substrates, or deformation of the substrate itself, can be a problem. Furthermore, the difference in lattice constant and coefficient of thermal expansion between the nitride semiconductor thin film formed on the substrate and the substrate can damage a thin film, which can be a problem.

Additionally, as an example of making a light emitting device, an n-type GaN layer,
InGaN active layer and a p-type GaN layer can be formed on top of a sapphire substrate. Impurities such as Mg and Si should be doped on top of the single GaN layer to form the N-type GaN and p-type GaN layers. In this case, if the heating temperature of the substrate is above 1,000° C. the diffusion of the doping impurity atoms is activated. For example, Mg doping atoms used to form the p-type GaN layer may spread into the multi-quantum well, the active layer of an LED, so that the emission characteristics of the light-emitting device is impaired. This may happen in the n-type GaN layer as well. Therefore, the emission characteristics of the light-emitting device will be ultimately degraded.

Patent No. 10-0251035 of the Republic of Korea suggests a method to make a single
crystal thin film using a neutral particle beam after an amorphous or polycrystalline thin film is made on the substrate using plasma CVD as described above.

However, the method disclosed in the publication above requires in advance the manufacture of amorphous or polycrystalline thin films by the plasma CVD method in order to obtain the desired single crystal thin films. Also, since reflectors of various structures should be provided in order to investigate the predetermined angle of the neutral particle beam for the purification of the films, a lot of effort must go into the production process and complex production equipment is required, which then increases the production costs of the semiconductor light-emitting devices leading to a lower LED supply or decreased marketability.

THE DETAILED DESCRIPTION OF THE INVENTION

Technical Challenges

Therefore, the goal of this invention is to supply a manufacturing method and apparatus for manufacturing a light emitting device using a neutral particle beam that can grow high quality nitride semiconductor single-crystal thin films while maintaining a process temperature much lower than in conventional manufacturing processes. Hereby, in order to solve the aforementioned problems when manufacturing semiconductor light emitting devices, instead of using a high process temperature applied to the substrate, a neutral particle beam of the appropriate energy is instead used.

Another object of the invention is to simplify the required equipment and reduce the effort to manufacture high quality nitride semiconductor single crystal films in order to improve the price competitiveness of semiconductor light emitting devices.

Also, the other purpose of this invention is to supply the best manufacturing method and apparatus for producing light-emitting elements by considering the characteristics of the process that is required for each layer in the formation of light emitting devices.

Technical Solution

The present invention can provide A method of forming a nitride semiconductor single crystal thin film which comprises a step in which a neutral particle beam including nitrogen (N) atoms and inert elements is emitted from the neutral particle beam source equipped with neutralizing reflector and using the electron cyclotron resonance (ECR) plasma generating system; and a step in which solid elements III are emitted just before or after the neutral particle beam reaches the substrate, such that a nitride semiconductor single-crystal thin film is deposited on the substrate by the neutral particle beam and the solid elements III.

The present invention also provides a method of forming a nitride semiconductor single crystal thin film further comprising a step in which solid element for doping is emitted to be provided directly on the nitride semiconductor single-crystal thin films during the formation by the said method of forming a nitride semiconductor single crystal thin film without precursor gas injection, simultaneously with the step of the solid elements III emission.

Additionally, the present invention provides a method of forming a nitride semiconductor single crystal thin film in which the solid elements III is emitted simultaneously with emission of the neutral particle beam including nitrogen (N) and inert gas,
and solid element for doping is emitted on the nitride semiconductor single crystal thin film being formed also simultaneously.

Also, the present invention provides a method of forming a nitride semiconductor single-crystal thin film wherein the inert elements can be one of Ar, He, Ne, Kr, and Xe or a mixture of two or more of these elements.

Also, the present invention provides a method of forming a nitride semiconductor single-crystal thin film in which the temperature of the substrate is maintained between 200° C. and 800° C.

Also, the present invention provides a method of forming a nitride semiconductor single-crystal thin film in which the temperature of the substrate is maintained between 600° C. and 700° C.

Also, the present invention provides a method of forming a nitride semiconductor single-crystal thin film in which the solid elements III emitting step comprises a modulation mode that emitting on and off operations are periodically repeated.

Also, the present invention provides a method of forming a nitride semiconductor single-crystal thin films in which the equation of the ratio of emission on time $\tau_{on}$ and emission off time $\tau_{off}$ $$\frac{\tau_{off}}{\tau_{on}} \geq \frac{\Gamma_{III}}{\gamma \Gamma_n} - 1$$

is satisfied.

Hereby, $\Gamma_m$ is the flux of solid elements III (atoms/cm$^2$s), $\Gamma_n$ is the neutral particle beam flux, $\gamma$ is the ratio of nitrogen atoms in the neutral particle beam, $\tau_{on}$ is the emission on time and $\tau_{off}$ is emission off time.

Also, the present invention provides a method of forming a nitride semiconductor single crystal thin film using a neutral particle beam of energy between 2 and 100 eV.

Also, the present invention provides a method of forming a nitride semiconductor single crystal thin film using a neutral particle beam of energy between 10 and 30 eV.

Also, the present invention provides a method of forming a nitride semiconductor single-crystal thin film in which the potential V required for the generation and energy supply of the neutral particle beam used satisfies the following equation.

$$V = -\frac{1}{\gamma_E} \frac{E_n}{q} - V_p$$

In the above formula, $E_n$ is the energy of a neutral particle beam, $V_p$ is the plasma potential, q is the charge of the plasma charged particles, $\gamma_E$ is the energy efficiency that is maintained when the plasma charged particles are converted to neutral particles after the particles have been reflected by the reflector. It ranges between 0.3 and 0.9 depending on the reflector material and the angle of incidence.

Also, the present invention provides a method of forming a nitride semiconductor single-crystal thin film in which $E_{Ga}$, the energy of Ga atoms gained from the kinetic energy of the neutral particle beam $E_n$ through collision can be obtained from the following equation $$E_{Ga} = \frac{4 M_{Ga} M_n}{(M_{Ga} + M_n)^2} E_n \cos^2 \theta$$

Hereby, $M_{Ga}$ is the mass of the Ga atoms, $M_n$ is the mass of the neutral particle beam elements, $\theta$ is the angle between the direction of motion of the Ga atoms after the collision and the direction of motion of the elements of a neutral particle beam shortly before the collision.

Also, the present invention provides a method of forming a nitride semiconductor single-crystal thin film in which on-and-off cycle of the emission of the solid elements III and the emission of doping solid elements is synchronized and repeated periodically.

Also, the present invention provides a method of forming a nitride semiconductor single-crystal thin film in which on-and-off cycle of the emission of the solid elements III and the emission of doping solid elements is out of synch, i.e., alternated and repeated periodically.

Also, the present invention provides a system of forming a nitride semiconductor single-crystal thin film in which can be characterized as including a neutral particle beam generator in which nitrogen (N) and the inert elements are emitted as neutral particles on a substrate;

a solid elements generator in which the solid elements III are emitted toward the substrates during the operation of the neutral particle beam generator; and a doping solid elements generator for providing doping elements in the formation of nitride semiconductor single-crystal thin films.

Also, the present invention provides a method of manufacturing a light emitting device, including a step in which an n-type semiconductor layer is formed by doping n-type elements using the metal organic chemical vapor deposition (MOCVD) method;

a step in which an active layer is formed using a neutral particle beam;

a step in which p-type semiconductor layer is formed using a neutral particle beam including p-type doping elements.

Also, the present invention provides a system for manufacturing a light emitting device which includes a first chamber in which an n-type semiconductor layer is formed by doping n-type elements using the metal organic chemical vapor deposition (MOCVD) method;

a second chamber in which an active layer is formed by a neutral particle beam with neutral particle beam generating device; and a third chamber in which a p-type semiconductor layer is formed using a neutral particle beam including p-type doping elements in which the third chamber includes a neutral particle beam generating device, a solid elements generator in which the solid elements III are emitted toward the substrates during the operation of the neutral particle beam generator, and a p-type doping solid elements generator for directly providing p-type doping elements without requiring a precursor gas injection on nitride semiconductor single-crystal thin film in formation.

Also, the present invention provides a system for manufacturing a light emitting device, including a first chamber in which an n-type semiconductor layer is formed by doping n-type elements using the metal organic chemical vapor deposition (MOCVD) method; and a second chamber in which an active layer is formed by a neutral particle beam with neutral particle beam generating device, the second chamber includes a neutral particle beam generating device, a solid elements generator in which the solid elements III are emitted toward the substrates during the operation of the neutral particle beam generator, and a p-type doping solid elements generator for directly providing p-type doping elements without requiring a precursor gas injection on nitride semiconductor single-crystal thin film in formation.

Effect of the Invention

As a result of the present invention, the temperature of the substrate can be lowered considerably since the energy required for the formation of nitride semiconductor single crystal thin films during the manufacture of a light emitting device is determined by the arrangement of the quantum of thermal energy and by the kinetic energy of the neutral particle beam. Therefore, high efficiency and high quality LED devices can be manufactured because, compared to conventional technology, thermal deformation of the substrate itself can be prevented and the problems of diffusion of doping impurities over the boundaries in multilayer thin films of LED, will be resolved.

In addition, as a result of the present invention, since the nitride semiconductor thin film is formed as a single-crystal from the beginning by the neutral particle beam, a much more convenient method and device is provided, compared to methods and their corresponding manufacturing equipment wherein poly crystal thin film is formed and then single crystallized, so that the price competitiveness of semiconductor light emitting devices can be improved.

In addition, as a result of the present invention, the problem that the quality of the light-emitting device is degraded due to the diffusion of p-type impurities to other layers is prevented as though the doping efficiency of the p-type semiconductor layer in the light emitting element increases.

BEST MODE FOR CARRYING OUT THE INVENTION

Hereinafter, according to the present invention, the preferred embodiments are described in detail referring to the attached figures.

Figure 1:
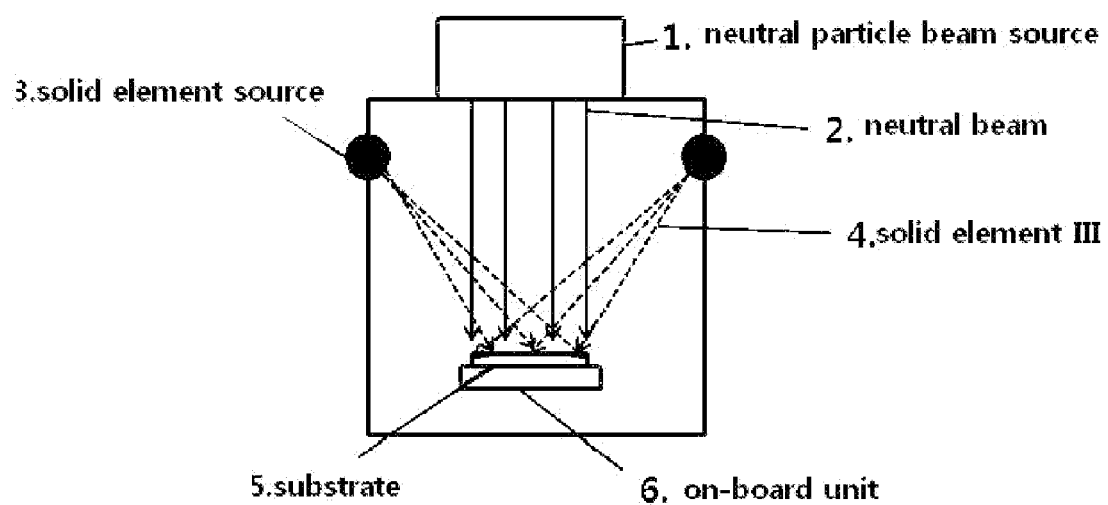
FIG. 1 is a system configuration to explain the nitride semiconductor single-crystal thin film formation process in accordance with the embodiment of the present invention.

FIG. 1 is a system configuration to explain the nitride semiconductor single-crystal thin film formation process in accordance with the embodiment of the present invention.

Figure 6:
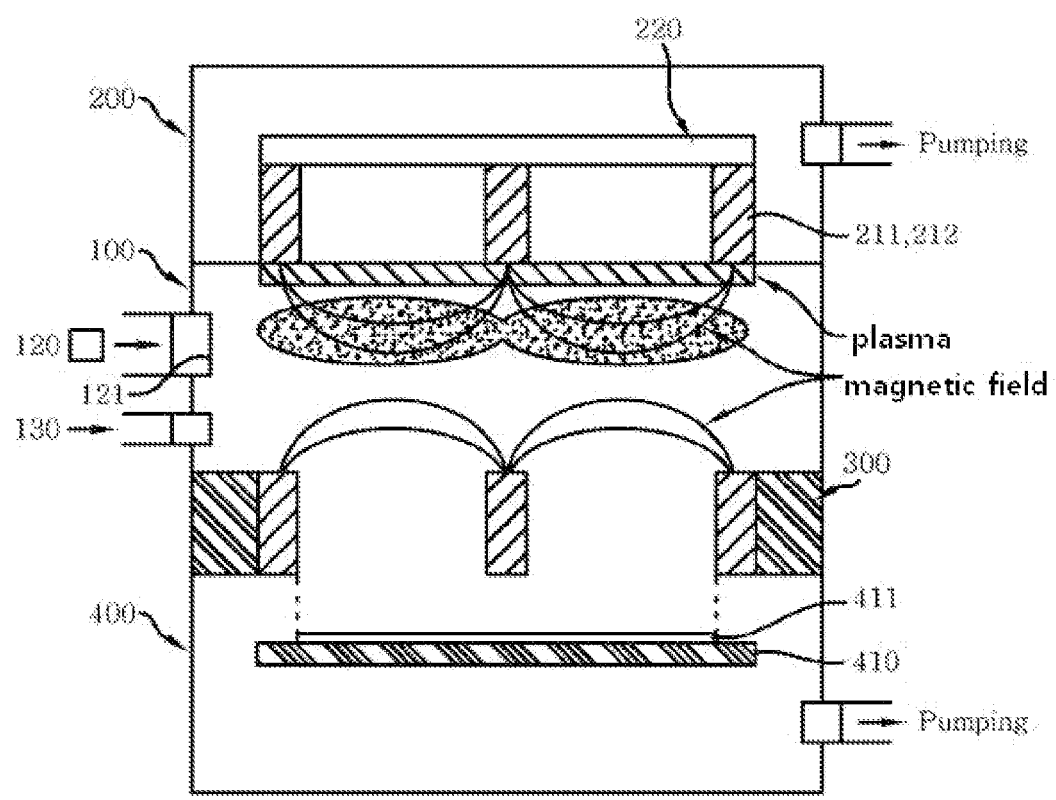
FIG. 6 is a system configuration of the neutral particle beam source used for the embodiment of the present invention.

A neutral particle beam source (1) is installed on the upper side of the process chamber (7) after the substrate in the process chamber (7) is mounted on the on-board unit (6)(FIG. 6). The above mentioned neutral particle beam source uses a plasma generation method by electron cyclotron resonance (ECR) and is equipped with a neutralization reflector and consists of magnetic structure. The source is invented by this inventor and a more detailed description can be found under the file of Korean Patent Application No. 10-2009-0051750. The configuration is omitted, but the above described content is incorporated in the present contents.

The neutral particle beam source (1) generates the nitrogen N) that is one of the reactants that are needed to form nitride semiconductor single crystal thin films that need to be deposited on the substrate (5) and inert elements that provides energy necessary for the chemical reaction of the reactants or formation of crystals to neutral particle beams, gives them kinetic energy and emits. The inert elements used in this embodiment are Argon (Ar), and nitrogen (N) which are emitted toward the substrate after generation of them into neutral particle beams.

In addition, inert elements used are Ar, He, Ne, Kr, Xe. They can be used alone or more than two elements can be mixed.

The solid elemental sources (3) are mounted at the top of the process chamber (7) and in the sources (3) group III solid elements, for example: Al, Ga, and In, are heated in effusion cell to be made vapored gas and injected into the process chamber (7).

The emission of the neutral particle beam and group ill solid elements evaporated gas emission are controlled to occur continuously at the same time, but unlike the neutral particle beam source (1), the solid elemental sources (3) can be operated in a mode in which emission on-and-off modulation is repeated periodically.

The number per unit area of the group Ill solid elements during the emission period should be the same or more than the number of nitrogen atoms in the neutral particle beam during the cycle (emission on time+emission off time). In other words, $$\Gamma_{III}\tau_{on} \geq \gamma \Gamma_n (\tau_{on} + \tau_{off})$$

Therefore, time ratio of emission on time and emission off time can be determined to be as follows:

$$\frac{\tau_{off}}{\tau_{on}} \geq \frac{\Gamma_{III}}{\gamma \Gamma_n} - 1$$

Hereby, $\Gamma_m$ is the flux of group III solid elements (atoms/cm$^2$s), $\Gamma_n$ is the neutral particle beam flux, is the ratio of nitrogen atoms in the neutral particle beam, $\tau_{on}$ is the emission on time and $\tau_{off}$ is the emission off time.

For example, if Ga, in an effusion cell, is vaporized at 1,200° C., the vapor pressure becomes 0.1 Torr which corresponds to $3 \times 10^{19}$ atoms/cm$^2$s flux.

The flux reaching the substrate is about $\Gamma_m = 5 \times 10^{15}$ atoms/cm$^2$s and if the neutral particle beam flux is $\Gamma_n = 6 \times 10^{15}$ atoms/cm$^2$s $\gamma = 0.5$, the nitrogen flux becomes $3 \times 10^{15}$ atoms/cm$^2$s, $\tau_{off}/\tau_{on} \geq 1.6$. If Ga is emitted for 10 seconds, at least 16 seconds can be maintained as the emission off time.

In addition to the method of solid element generation by effusion cell, solid elements can be obtained by irradiating a solid element target with electron beam, ion beam, or laser beam. Otherwise, they can be achieved by sputtering.

For example, since the vapor pressure is determined based on the heating temperature when Ga cell is vaporized in effusion cell, the solid element flux is determined by the vapor pressure at outlet, the desired flux can be provided by controlling the temperature. In other words, the flux $\Gamma$ at outlet is as below:

$$\Gamma = \frac{P}{\sqrt{MkT}}$$

Where P is the vapor pressure [Pa], M is the mass of elements to be vaporized [kg], k is Planck's constant, and T is the temperature [K]. For example, at 1,007° C., the vapor pressure is $10^{-3}$ Torr and at 1,132° C., the vapor pressure is $10^{-2}$ Torr. So, the corresponding flux for the solid elements at the outlet are each about $3 \times 10^{17}$ atoms/cm²s and about $3 \times 10^{18}$ atoms/cm²s.

After the emission of the vapor of solid elements, they do not have a particular direction. Either they diffuse within the process chamber (7) or drifted and reached on top of the substrate (5) at the lower of the chamber. The neutral particle beam including nitrogen and inert elements are emitted toward the substrate by collision with a reflector by applying a predetermined potential to the plasma from the source. Thus, the neutral particle beam has significant kinetic energy and downward momentum toward the substrate (5). Nitrogen included in neutral particle beam and Ga vapor, group III solid element, are chemically bonded on the substrate (5) to form GaN single crystal thin film. At this time, if the neutral particle beam flux is less than group III solid element flux, energy transportation is not enough to be required to form single crystal, whereby the neutral particle beam flux should be nearly the same as group III solid element flux to be expected to be bonded chemically to GaN and to be formed into single crystal. Therefore, preferably, the neutral particle beam source (1) and the solid elemental sources (3) should be controlled to become nearly the same as group III solid element flux with neutral particle beam flux just before or just after the group III solid element flux reach on the substrate (5).

In this embodiment, the temperature of the substrate (5) is between 200 and 800° C., and preferably between 600 and 700° C., it is heated to extremely low temperatures compared to conventional MOCVD method. This is because, in the conventional MOCVD method the energy needed for the chemical bonding of reactants and for forming the single crystal comes from the thermal energy supplied by heating the substrate. However, in this invention, the temperature of the substrate is lowered due to a reduction in the amount of heat energy that are provided by heating substrates, and the energy needed for chemical bonding of the reactants and for forming the single crystal is provided in the form of kinetic energy of the neutral particle beam energized.

In other words, the present invention enables group III elements participating in the growth of nitride semiconductor single crystals to have sufficient kinetic energy to react with the nitrogen to easily form nitride semiconductor single crystal structure so that it facilitates the growth of nitride semiconductor single crystal thin films under low temperatures and the characteristics of single-crystal thin films can be improved.

The formation of GaN single crystal thin films formed on a substrate (5) are as follows:

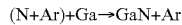

The left side brackets indicates a neutral particle beam consisting of N and Ar, in which the primary role of Ar is to transfer kinetic energy and momentum. In other words, the Ga atoms on collision with the substrate receive the kinetic energy and momentum from the Ar, to be converted to high energy Ga, which forms a GaN crystal by reaction with the N atoms in the neutral particle beam. This is a completely different and new method than the conventional method in which at first the GaN layer was formed, next annealed with neutral particles, ions, electrons or laser beam.

The $E_{Ga}$ energy of Ga atoms gained from the $E_n$ kinetic energy of the neutral particle beam through collision can be calculated using the following equation:

$$E_{Ga} = \frac{4 M_{Ga} M_n}{(M_{Ga} + M_n)^2} E_n \cos^2 \theta$$

Hereby, $M_{Ga}$ is the mass of the Ga atoms, $M_n$ is the mass of the neutral particle beam elements, θ is the angle between the direction of motion of the Ga atoms after the collision and the direction of motion of the elements of a neutral particle beam shortly before the collision. According to this equation, the Ga atoms can receive up to 93% of the energy of them from the Ar atoms in the neutral particle beam and up to 56% of the energy of them from the N atoms.

The kinetic energy of the neutral particle beam can be determined by the applied potential V to pull the plasma towards neutralization reflector at the beginning within neutral particle beam source. Thus, as described above, by adjusting the applied potential, the kinetic energy of the neutral particle beam can be adjusted from 1 to 100 eV for substrate heating temperatures between 200 and 800° C. and for temperatures between 600 to 700° C., 10 to 30 eV of kinetic energy can be given.

In addition, by analyzing the neutral particle beam generation mechanism, the potential V applied to neutral particle beam source for the neutral particle beam generation and the kinetic energy of the neutral particle beam given can be calculated as follows:

$$V = -\frac{1}{\gamma_E} \frac{E_n}{q} - V_P$$

In the above formula,
$E_n$ is the energy of the neutral particle beam,
$V_p$ is the plasma potential,
q is the charge of the plasma charged particles,
$\gamma_E$ is the energy efficiency that is maintained when the plasma charged particles are converted to neutral particles after the particles are reflected from the reflector. It ranges between 0.3 and 0.9 depending on the reflector material and the angle of incidence.

In addition, when fabricating semiconductor light-emitting devices, doped impurities are needed to make the said GaN single crystal thin film p-type or n-type.

In particular, when p-type doping is done based on the conventional MOCVD method, as a precursor of p-type doping reacting gas, molecular gas such as $Cp_2Mg$ containing a large amount of hydrogen gas, is used so that a large amount of hydrogen is generated during the thin film forming process and Mg doping efficiency is very poor because hydrogen is combined with Mg. On top of that, a large amount of excess precursor gases are used to meet the doping density under the lower doping efficiency. Thus, there is a large amount of undoped Mg leading to had properties of p-type GaN.

In the conventional MOCVD method, increasing the temperature to increase the doping efficiency of Mg causes gases to diffuse to the active layer of Mg whereas lowering the temperature and injecting a large amount of excess precursor gases causes the doping efficiency to be lowered and degrade p-type GaN by un-doped Mg.

However, the existing problems can be overcome with neutral particle beam and solid elements without hydrogen. Impurity doping system using a neutral particle beam and solid elements is shown in FIG. 2.

Figure 2:
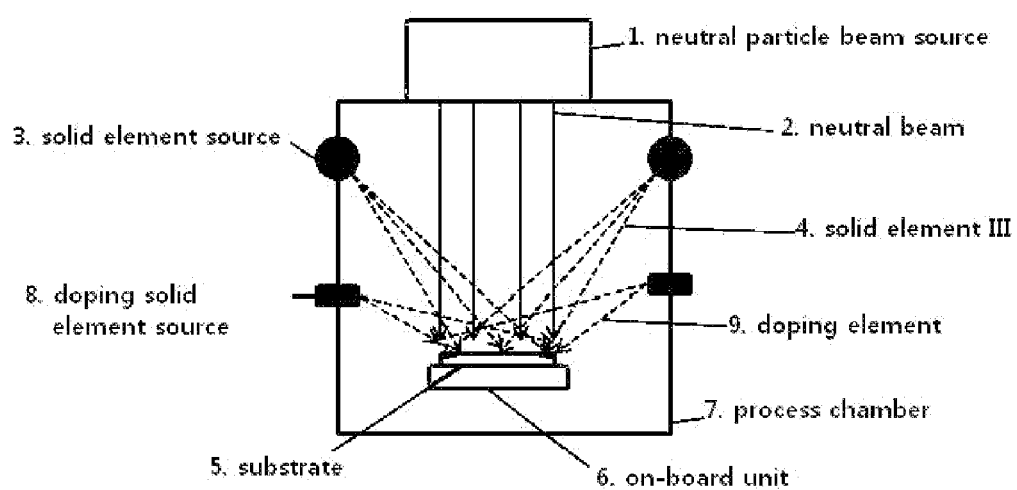
FIG. 2 is a system configuration for doping a nitride semiconductor single-crystal thin film that is manufactured in accordance with FIG. 1

FIG. 2 shows that the doping solid element source (8) is mounted on upper position of the process chamber (7). In the doping solid element source (8), doping elements such as Si or Mg required for doping to a layer, for example, GaN layer, are vaporized with sputtering device or electron beam irradiation device and the solid element vapor is injected into the process chamber (7). For Mg with low melting point of 650° C., effusion cells can be used, but for Si with the high melting point of 1,410° C., it is advantageous to be evaporated using sputtering device or electron beam irradiation device.

GaN layer is converted into n-type by introducing doping elements Si into GaN layer. Also, generally InGaN active layer is formed just on the n-type GaN layer and a p-type GaN layer is formed to make a semiconductor light-emitting device. For Mg element, it is doped to form a p-type GaN layer. The doping process is performed with the kinetic energy of the neutral particle beam and the temperature of the substrate (5) is relatively low temperature, 600 to 700° C., the problems that light-emitting properties are degraded due to the reduced characteristics of n-type and p-type caused by diffusion of elements at the temperatures higher than 1000° C. in conventional process can be solved. That is, in conventional MOCVD method, Mg doping atoms used to form the p-type GaN layer may spread into the multi-quantum well, the active layer of an LED to degrade functions of the active layer so that the emission characteristics of the light-emitting device is impaired. However, in this embodiment, kinetic energy of neutral particle beam provides a significant amount of reaction energy to allow the temperature of the substrate to be lowered and whenever each layer is formed, the kinetic energy of the neutral particle beam is controlled at an appropriate level so that the doping elements do not spread into the other layer, which can improve emission characteristics of the light-emitting device.

The doping process chemical reaction formula is shown as below:

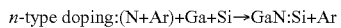

n-type doping:(N+Ar)+Ga+Si→GaN:Si+Ar

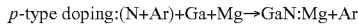

p-type doping:(N+Ar)+Ga+Mg→GaN:Mg+Ar

Mode for Embodying the Invention

Embodiments of a light-emitting device forming process that use both the MOCVD method and neutral particle beam epitaxial process will be described as follows.

Figure 3:
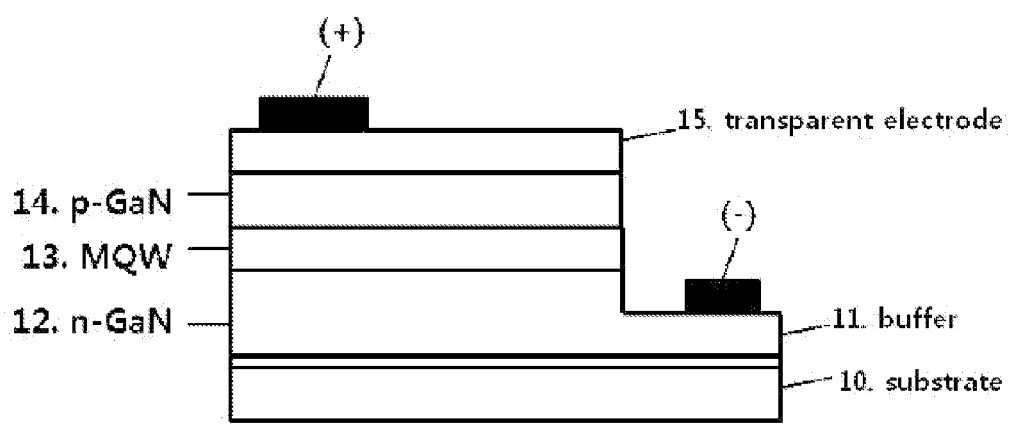
FIG. 3 is a cross-sectional view of the light emitting device in accordance with the embodiment of the present invention.

FIG. 3 is a sectional view of the light emitting device according to an embodiment of the present invention.

The light emitting device shown in FIG. 3 explains using the structure of the GaN-based light-emitting diode (LED). The light-emitting device includes a substrate (10), a buffer layer (11), the n-type semiconductor layer (12), multi-quantum well (MQW) (13), p-type semiconductor layer (14), and a transparent electrode layer (15). Sapphire can be used as the substrate (10) and the buffer layer (11) is consists of AlN or GaN with a low degree of crystallization.

Here, multi-quantum well (MQW) (13) as an active layer can be made of InGaN. As above detailed description, the n-type semiconductor layer (12), multi-quantum well (MQW) (13) and p-type semiconductor layer (14) can be made with neutral particle beam.

Figure 4:
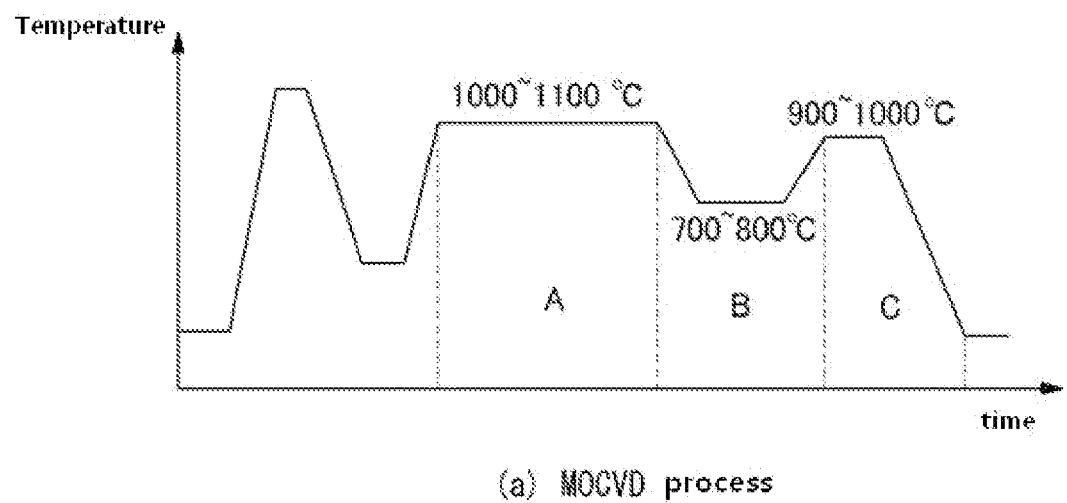
FIG. 4 is a diagram comparing the neutral beam epitaxial and the MOCVD manufacturing processes for the light emitting devices.
Figure 4:
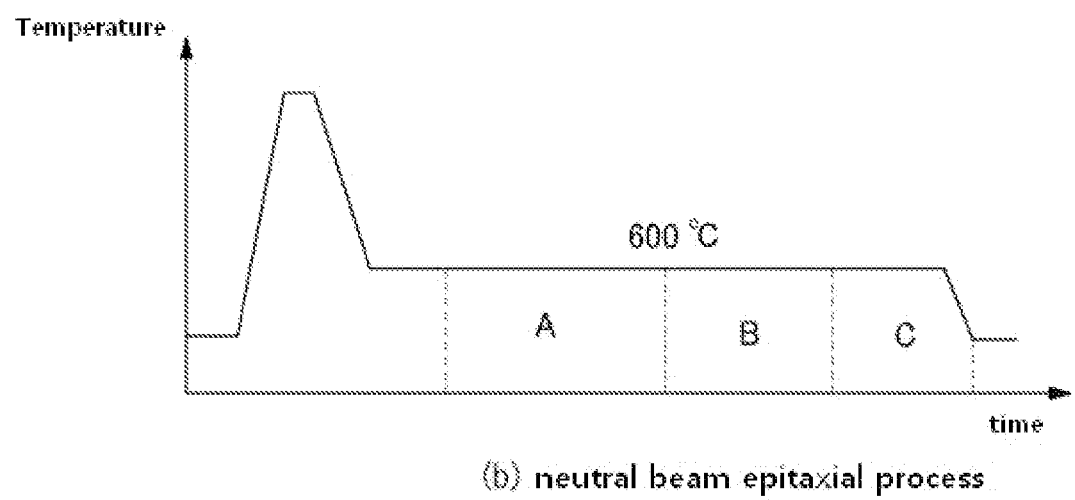

FIG. 4 is a diagram comparing neutral particle beam epitaxial process with MOCVD process in light emitting device manufacturing.

Reviewing MOCVD process shown in FIG. 4(a), after a substrate is cleaned at high temperature, the buffer layer (11) is formed at low temperature. Next, the region A of 1,000~1,100° C. condition, n-type semiconductor layer (12) is formed. Then, the region B of 700~800° C. condition, p-type semiconductor layer (14) can be formed.

Here, it is noteworthy that the doping efficiency of p-type element in the region C for forming the p-type semiconductor layer (14) is much lower than that of n-type element. More in detail, high temperature thermal energy should be provided because the doping efficiency of p-type element (e.g., $Mg^+$) is dependent on a temperature purely (thermal energy increases mobility of Ga atoms and activates $Mg^+$ to enhance a replacement possibility). On the other hand, if the entire substrate is heated at excessive high temperature, p-type element $Mg^+$ diffuses into n-type semiconductor layer (12) or multi-quantum well (MQW) (13), deteriorate a quality of overall the light emitting device.

Finally, in MOCVD process, if the p-type semiconductor layer (14) be formed with low temperature treatment, the doping efficiency of p-type element decreases and p-type element cannot participate in crystallization to occur a problem of degrading conductance, on the contrary, with high temperature treatment, p-type element diffusion occur a problem of degrading quality of overall light emitting device.

On the other hand, in case of applying neutral particle beam epitaxial process as shown in FIG. 4(b), it is advantageous that doping efficiency can be increased, damage of a substrate prevented and diffusion of p-type element prevented, since doping can be allowed at a relatively lower level of 600° C. than in MOCVD process.

Meanwhile, MOCVD process has advantage of lower price of manufacturing system and shorten a process time rather than neutral particle beam epitaxial process. Accordingly the present inventors designed hybrid process combined with the two processes to allow light emitting device to be manufactured at low cost with high quality.

Figure 5:
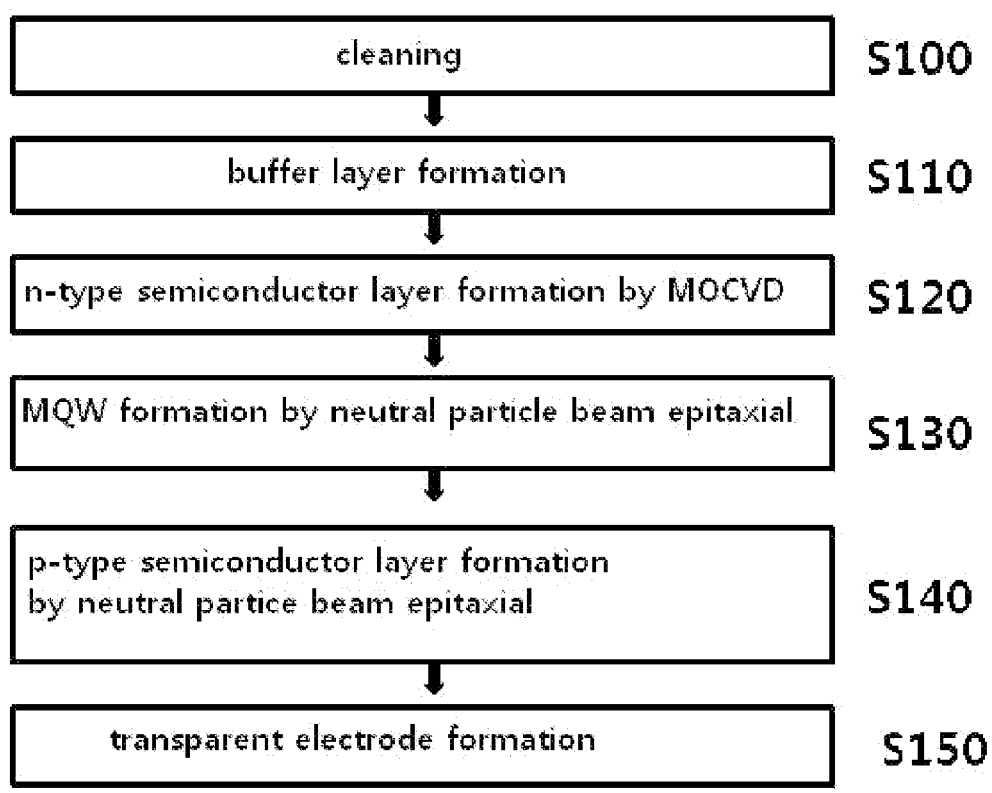
FIG. 5 is a flowchart illustrating a method of manufacturing a light emitting device according to another embodiment of the present invention.

FIG. 5 is a flowchart illustrating a method of manufacturing a light emitting device according to the said hybrid process embodiment of the present invention.

In step (S100) and (S110), the substrate is cleaned and buffer layer is formed. A conventional method applied to manufacturing GaN-based LED can be employed in the present steps as a substantial process.

In step (S120), n-type semiconductor layer is formed using MOCVD. Here, Si can be used as n-type element. Because n-type semiconductor layer has higher doping efficiency than p-type semiconductor layer, if MOCVD process be applied, n-type element can be doped at high processing speed and efficiently.

Next, in a step (S130), MQW layer is formed by neutral particle beam epitaxial process. The said MQW layer can consist of InGaN.

In step (S140), p-type semiconductor layer is formed by neutral particle beam epitaxial process. $Mg^+$ can be used as a p-type element of the p-type semiconductor layer. Here, a p-type element has doping efficiency much lower than n-type element. Furthermore, at high temperature, it is worry that doping elements should diffuse into other layers. However, in forming the p-type semiconductor layer of step (S140), neutral particle beam epitaxial process allowing a low temperature treatment is applied such that doping efficiency can be improved and quality of a light emitting device prevented from deterioration at the same time.

In step (S150), a transparent electrode is formed on the p-type semiconductor layer. Formation of the transparent electrode can be embodied by a method of sputtering or neutral particle beam etc.

In the present embodiment shown in FIG. 5, steps (S120, S130, S140) can be proceeded in other chambers respectively. For example, the treated substrate is put in the chamber for doping n-type element by MOCVD to form n-type semiconductor layer by robot arm at first, in another chamber for forming MQW layer by neutral particle beam to form MQW layer, next, put in the other chamber for doping p-type element by neutral particle beam to form p-type semiconductor layer.

Figure 7:
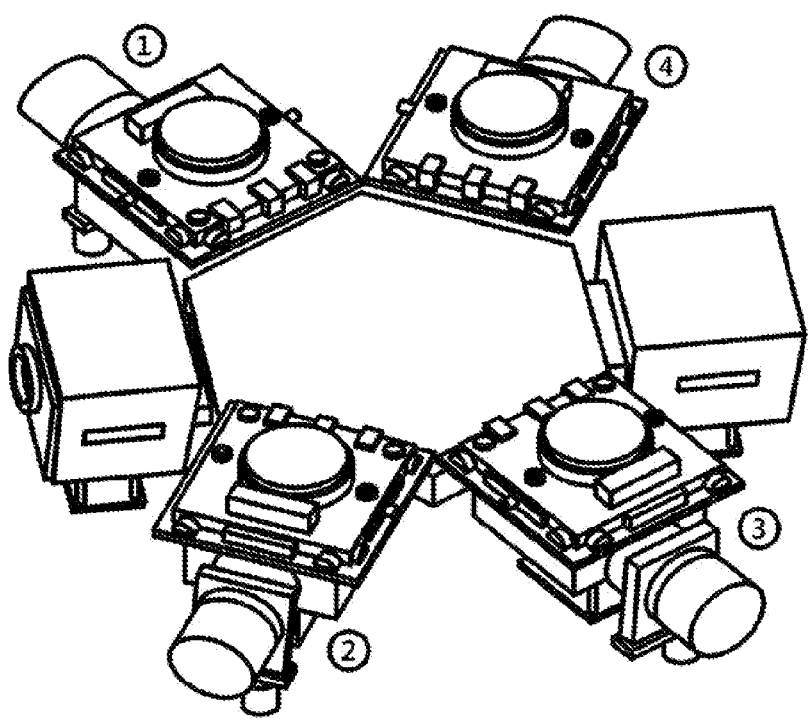
FIG. 7 is a schematic perspective view of a system configuration embodying the hybrid process of the present invention.

That is, the entire processes can be performed with the $1^{st}$ chamber for MOCVD, the $2^{nd}$ chamber for forming MQW layer by neutral particle beam, and the $3^{rd}$ chamber for doping the p-type element by neutral particle beam (refer to FIG. 7). However, the said two processes by neutral particle beam can be proceeded sequentially and separately in the same chamber.

A substantial embodiments proceeded by neutral particle beam in the chamber have already been described enough in the above.

According to the said constructions, formation of n-type semiconductor layer with good doping efficiency is proceeded by MOCVD with high processing speed, while formation of p-type semiconductor layer with relatively poor doping efficiency is proceeded by neutral particle beam, such that overall quality of light emitting device and manufacturing efficiency can be both improved.

It is axiomatic that the right of the present invention is not limited to the working examples, which were explained above, but defined by what is written in the range of claims, and that the person with the general knowledge of this field can perform various changes and adapt within the range of right that is written in the range of claims.

INDUSTRIAL AVAILABILITY

The present invention can be applied to manufacturing light emitting devices such as LED or LD etc., since semiconductor single crystal thin film can be formed in high quality under lowered temperature of a substrate using neutral particle beam.

What is claimed:

1. A method of forming a nitride semiconductor single crystal thin film which comprises
    a step in which a neutral particle beam including nitrogen (N) atom and inert element is emitted from the neutral particle beam source equipped with neutralizing reflector and using the electron cyclotron resonance (ECR) plasma generating system; and
    a step in which solid element III is emitted just before or after the neutral particle beam reaches the substrate, such that a nitride semiconductor single-crystal thin film is deposited on the substrate by the neutral particle beam and the solid element III
    wherein the temperature of the substrate is maintained between 200° C. and 800° C.; and
    wherein the kinetic energy of the neutral particle beam is between 10 eV and 30 eV.

2. In claim 1, the method of forming a nitride semiconductor single crystal thin film further comprising
    a step in which a solid element for doping is emitted without precursor gas injection onto the nitride semiconductor single-crystal thin films, simultaneously with the step of the solid element III emission.

3. In claim 1, the method of forming a nitride semiconductor single-crystal thin film
    wherein the inert element can be one of Ar, He, Ne, Kr, and Xe or a mixture of two or more of these elements,
    wherein the said solid elements III can be one of Al, Ga or In, or a mixture of two or more of these elements.

4. In claim 1, the method of forming a nitride semiconductor single-crystal thin film in which the solid element III emitting step comprises a modulation mode that emitting on and off operations are periodically repeated.

5. In claim 4, the method of forming a nitride semiconductor single-crystal thin film in which a ratio of emission on time $\tau_{on}$ and emission off time $\tau_{off}$ satisfies $$\frac{\tau_{off}}{\tau_{on}} \geq \frac{\Gamma_{III}}{\gamma \Gamma_n} - 1.$$

Here, $\tau_m$ is a flux of solid element III (atoms/cm²s), $\Gamma_n$ is a neutral particle beam flux, $\gamma$ is a ratio of nitrogen atom in the neutral particle beam, $\tau_{on}$ is the emission on time and $\tau_{off}$ is emission off time.

6. In claim 4, the method of forming a nitride semiconductor single-crystal thin film in which each on-and-off cycle of the emission of solid element III and the emission of doping solid elements is synchronized and repeated periodically.

7. In claim 4, the method of forming a nitride semiconductor single-crystal thin film in which each on-and-off cycle of the emission of solid element III and the emission of doping solid element is alternatively asynchronous and repeated periodically.

* * * * *